TRANSISTORIZED GATING CIRCUIT FOR CONTROLLED RECTIFIERS

Filed July 25, 1962

INVENTOR
RAYMOND H. LEGATTI
BY Blum, Moscovitz, Friedman and Blum
ATTORNEYS.

United States Patent Office 3,258,678
Patented June 28, 1966

3,258,678
TRANSISTORIZED GATING CIRCUIT FOR CONTROLLED RECTIFIERS

Raymond H. Legatti, Bellport, N.Y., assignor to Electromagnetic Industries, Inc., Sayville, N.Y., a corporation of New York Filed July 25, 1962, Ser. No. 212,224
10 Claims. (Cl. 322—28)

This invention relates to control circuits of the type in which a controlled characteristic is modulated by the use of controlled rectifiers, such as, for example, silicon controlled rectifiers, responsive to gating or triggering signals from a control circuit. More particularly, the present invention is directed to novel gating means for a solid state controlled rectifier, such as a silicon controlled rectifier, used in a control circuit of this type, and with the gating being effected through the medium of a transistor amplifier.

As is known to those skilled in the art, silicon controlled rectifiers act to block current flow in both directions until they are triggered by a gating signal, at which time they become fully conductive. They thus operate in essentially the same manner as thyratrons, and are sometimes referred to as "solid state thyratrons." These rectifiers are known to the art as "SCR's," and will be hereinafter referred to by that term.

Particularly in instances where the control signal may have a relatively small value, it is necessary to preamplify the control signal to provide an effective gating signal for the controlled rectifier. A known arrangement for doing this is to use a magnetic amplifier as a preamplifier for the gating current provided in response to the control signal.

However, there are disadvantages to the known arrangements, among which is the fact that control is effected through about only 150 degrees, rather than through the full 180 degrees, of a half wave of alternating current. Another disadvantage is that the magnetic amplifiers are limited as to the frequency range which can be handled, in addition to which such magnetic amplifiers introduce reactance into the circuit.

In accordance with the present invention, it has been found that, by use of a novel circuit configuration, a transistor amplifier may be used to control the gating current or signal to a silicon controlled rectifier or SCR. More particularly, the collector-emitter circuit of a transistor amplifier is connected, in series with a blocking diode, across the anode-gate circuit of the SCR. The voltage drop across the SCR, when the latter is non-conducting, thus provides a potential across the emitter-collector circuit of the transistor, so that the emitter-collector circuit of the transistor will conduct when the emitter-base circuit of the transistor is forward biased.

A control signal or potential is applied across the emitter-base circuit of the transistor and, under normal conditions, has a value and polarity such that the emitter-base junction is forward biased. Consequently, and under these normal circumstances, a gating pulse will be applied to the SCR during each half wave of A.C. potential impressed across the parallel arrangement of the SCR and the emitter-collector circuit of the transistor. The magnitude of the control potential impressed across the input or emitter-base circuit of the transistor will determine the point, during each half cycle, at which the SCR conducts. Once the SCR conducts, it acts like a closed switch so that there is no longer any potential across the emitter-collector circuit of the transistor so that there is no flow of current through the latter until the next half cycle.

More specifically, the emitter of the transistor is connected to the anode of the SCR, and the collector of the transistor is connected to the anode of the blocking diode. The cathode of the diode is connected to the gate of the SCR. The diode therefore acts as a gating diode which allows current flow in one direction from the collector of the transistor to the gate of the SCR.

In further accordance with the invention, a capacitor is connected across the emitter-base circuit of the transistor and thereby the relative phase or "time constant" of the gating current, with respect to the potential applied across the silicon controlled rectifier, can be varied.

The capacitor, in conjunction with a resistor, forms part of a resistance-capacitive time constant network which is inserted in the emitter-base circuit of the transistor amplifier. A control signal charges the capacitor at a rate determined by the value of the resistor and the magnitude of the control signal.

The capacitor discharges through the emitter-base resistance of the transistor amplifier, which is connected across the capacitor. This switches the transistor "on." The period of the half cycle during which the associated SCR conducts is determined by the magnitude of the control signal altering the response time of the resistance-capacitive network. Thus, the conduction angle of the SCR can be controlled over zero to 180 electrical degrees by applying a control signal of suitable magnitude to the emitter-base circuit of the transistor amplifier.

In a specific embodiment of the invention, a pair of SCR's are utilized, each having a transistor with its collector-emitter circuit connected between the anode and gate of the respective SCR and furnishing the gating current through a blocking diode. The transistors are arranged in a common emitter configuration, whereby they may be used with either single phase or polyphase A.C. systems.

With the invention arrangement, not only it is possible to obtain control over substantially the full 180 degrees of the half cycle, as compared to the control over only about 150 degrees of the half cycle possible with magnetic amplifiers, but also, as the transistor has substantially no reactance, the control system can be used over substantially any frequency range within the possible limits of control ranges. The only limiting factor is the frequency response characteristic of the SCR's, which generally are limited to frequency ranges of a few thousand cycles per second. A further advantage is that, if the control signal becomes zero, the transistor is cut off and there is no output through the silicon controlled rectifiers. This provides what, in effect, is a "fail safe" arrangement.

An advantage of the common emitter connected transistor arrangement is that a single input signal need not be subdivided in the case of controlling, for example, a polyphase alternating current system. Thus, no isolating windings or transformer windings are necessary in order to be able to use a single control signal. It may be necessary, however, to use isolating resistors in the base circuit of each transistor.

For an understanding of the principles of the invention, reference is made to the following description of a typical embodiment thereof as illustrated in the accompanying drawings. In the drawings.

Figure 1:
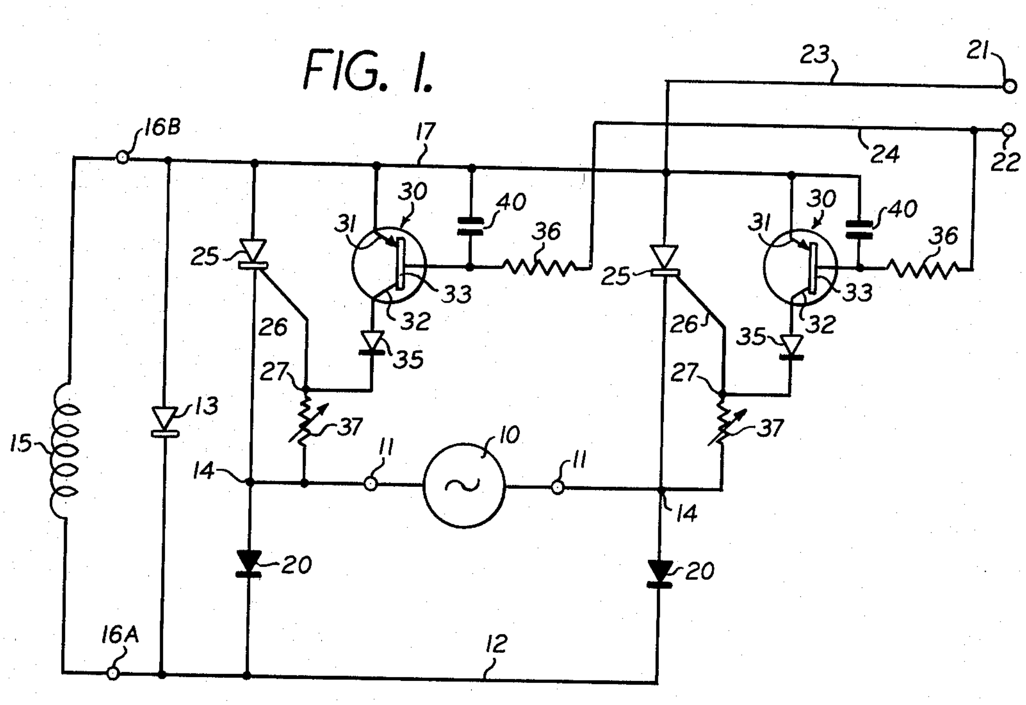
FIG. 1 is a schematic wiring diagram of an A.C. generator voltage control crcuit embodying the present invention.

In FIG. 1 of the drawing, the invention is illustrated as incorporated in an A.C. generator voltage control circuit in which the field excitation is supplied from the armature output and is modulated, by the invention control means, to maintain the armature output voltage at a pre-set value. In practical effect, the invention control means comprises a full-wave bridge circuit which is interposed between the generator armature output voltage and the input terminals of the generator field winding. While the arrangement is illustrated, merely by way of example, as applied to regulating the voltage of a single phase A.C. generator, it should be understood that the arrangement may equally be applied to regulating the output voltage of a polyphase A.C. generator, or to any other type of control wherein a current flow is to be modulated responsive to the value and sign of a differential control signal. The type of control circuit schematically illustrated in FIG. 1 may also be called a power supply which is incomplete as the loop has not been closed. Thus, the SCR's control the flow of current to the generator field winding, and the time interval during which such current flows is determined by the value of the differential control signal which is a function of the output voltage of the generator armature.

Referring to FIG. 1, the control is applied to an A.C. generator including an armature 10 and a field winding 15. Armature 10 has output terminals 11, and field winding 15 has terminals 16A and 16B, of which terminal 16A may be considered the positive terminal and terminal 16B may be considered the negative terminal. To provide the field excitation, a circuit is provided which connects the armature terminals 11 through diodes 20 to a conductor 12 connected to positive terminal 16A of field winding 15. The negative terminal 16B is connected to a conductor 17. As the field winding 15 comprises an inductive load on the armature 10, a diode 13 is connected across the field winding to prevent spurious signals from being injected into the controlled rectifiers possibly to cause a malfunction thereof.

The control elements include a pair of SCR's 25, 25 each connected in series with a respective diode 20 which gates the current flow through the associated SCR 25. More specifically, the anode of each SCR 25 is connected to conductor 17, and the cathode of each SCR 25 is connected, through a junction point 14, to the anode of the associated diode 20. The SCR's 25 with their associated gating diodes 20 in effect provide a full-wave bridge circuit connected between the armature 10 and the field winding 15.

Each SCR is provided with a gating circuit 26 connected to a junction point 27. The gating of each SCR 25 is controlled by means of a transistor amplifier 30, each of the transistor amplifiers having an emitter 31, a collector 32, and a base 33. The gating signal is provided through the emitter-collector circuit of each transistor amplifier 30 and, for this purpose, the emitters 31 are connected to the conductor 17 and each collector 32 is connected to the anode of a respective diode 35. The cathode of each diode 35 is connected to the junction point 27 of the gating circuit 26.

The control signal is applied to the emitter-base circuit of each transistor and, for this purpose, an isolating resistor 36 is connected to each base 28, and forms part of a time constant network. In accordance with an important feature of the invention, a capacitor 40, forming part of such time constant network, is connected between each emitter 31 and the junction of the associated base 33 to its isolating resistor 36. Capacitor 40 thus has the emitter-base resistance thereacross. To apply the control signal to the emitter-base circuits of the transistor amplifiers 30, signal input terminals 21 and 22 are provided.

A conductor 23 connects input terminal 21 to conductor 17, and a conductor 24 connects input terminal 22 to the ends of resistors 36 remote from the bases of the associated transistors.

Figure 2:
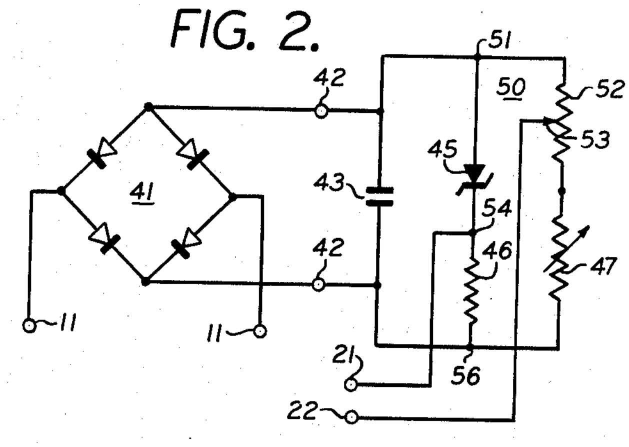
FIG. 2 is a schematic wiring diagram of a non-linear bridge which may be utilized to provide the differential voltage control signal for the control circuit shown in FIG. 1.

The control signal may be applied to the terminals 21–22 in any desired manner and from any desired source. One way of doing this is illustrated in FIG. 2, which illustrates an arrangement involving a non-linear bridge in which the voltage of armature 10, or a fixed proportion thereof, is compared with a fixed reference voltage and the differential between the two is applied to terminals 21 and 22. Thus, in FIG. 2, the voltage across armature terminals 11, 11 is rectified by a full-wave bridge 41 and applied to terminals 42, 42 of a non-linear bridge generally indicated at 50. A condenser 43 is connected across the terminals 42, 42. The bridge 50 includes, in one arm thereof, a Zener diode 45, which in a known manner, has a fixed voltage or voltage drop thereacross. The anode of Zener diode 45 is connected, at a junction point 51, to one terminal of a potentiometer 52 having an adjustable tap 53. The cathode of Zener diode 45 is connected, at a junction point 54, to a resistance 46 in turn connected, at a junction point 56, to a variable resistance 47 which is connected in series with the potentiometer 52. The armature voltage, or a fixed proportion thereof, as rectified by the full-wave bridge 41, is used to impress a D.C. potential across the terminals 51 and 56 of the non-linear bridge 50. The differential signal output terminal 21 is connected to the junction point 54, and the differential signal output terminal 22 is connected to the adjustable tap 53 of the potentiometer 52.

Depending upon the relative magnitude of the D.C. input signal from the full-wave bridge 41 as compared to the voltage drop across the Zener diode 45, a differential voltage signal is available at the terminals 21 and 22, and will have a sign corresponding to the relative direction of the differential between the D.C. armature voltage signal and the voltage drop across Zener diode 45. The differential signal voltage can be regulated by adjustment of the tap 53.

The voltage drop across each SCR 25, in the non-conducting state of the latter, provides the operating potential across the emitter-collector circuit of the associated transistor 30. The capacitor 40, in conjunction with the resistor 36, forms part of a resistor-capacitor time constant network which is inserted in the emitter-base circuit of the associated transistor amplifier 30. The control signal, from the terminals 21 and 22, charges capacitor 40 at a rate determined by the value of the associated resistor 36 and the magnitude of the control signal.

Capacitor 40 discharges through the emitter-base resistance of the associated transistor amplifier 30, which resistance is across capacitor 40. This switches the associated transistor 30 "on." The period of the half cycle that the associated SCR 25 conducts is thus determined by the magnitude of the control signal altering the response time of the resistor-capacitor network. Thereby, the conduction angle of the SCR 25 can be controlled from zero to 180 electrical degrees by applying the control signal of a suitable magnitude to the emitter-base circuit of the associated transistor amplifier 30. It will be noted that, with no forward bias on its emitter-base circuit, each transistor 30 acts like an open switch with substantially no current flow therethrough. However, once a sufficient forward bias is applied to the emitter-base circuit of a transistor 30, by discharge of its associated capacitor 40, the emitter-collector circuit becomes fully conductive so that the transistor acts like a closed switch. Once the SCR 25 conducts, it, in turn, acts like a closed switch across the emitter-collector circuit of the associated transistor 30, so that there is no longer any potential drop across the emitter-collector circuit and the transistor ceases to conduct. The value of the voltage drop effective upon the emitter-collector circuit of each transistor may be adjusted by means of a variable resistor 37 connected between each junction point 27 and a junction point 14.

In normal operation, the several constants are so adjusted that, during each half cycle of A.C. potential, the particular SCR 25 will be triggered or gated conductive for a sufficient portion of such half cycle that the excitation of the field 15 will be of a value such as to produce a predetermined output voltage at the armature terminals 11. Should the armature voltage, as applied at the terminals 11, exceed such predetermined value, the value of the differential control signal applied to terminals 21 and 22 will be such that the period of each half cycle during which an SCR 25 conducts will be reduced. Thereby, the average current flow through the field winding 15 will be reduced so as to reduce the armature output voltage to its predetermined value. The converse will take place upon a decrease in the output voltage of the armature, as measured at its terminals 11. When this occurs, each SCR 25 is gated to a conductive state at an earlier portion of each half cycle, whereby the excitation of the field winding 15 is increased to an extent sufficient to restore the voltage of armature 10 to its predetermined value.

If the armature voltage, as applied as a D.C. voltage to the terminals 42 of the non-linear bridge, equals the Zener diode voltage drop, the transistors 30 become nonconductive. Should the D.C. voltage corresponding to the armature voltage exceed the Zener diode voltage, the transistors 30 are reverse biased. This is useful in that it prevents "running away" of the transistors due to overheating by flow of collector current therethrough.

Figure 3:
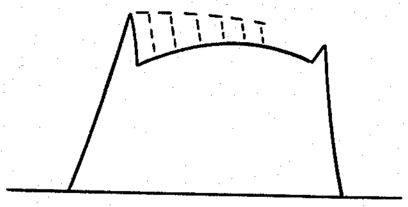
FIG. 3 is a set of curves illustrating the operation of the control circuit shown in FIG. 1.

FIG. 3 illustrates the wave form of the pulse for gating the SCR. It will be noted from this figure that this pulse appears as a sharp spike added to a half cycle voltage wave. Depending upon the portion of the cycle at which the SCR is gated, the pulse or spike will appear either as a narrow pulse or spike or as one which is broadened in accordance with the particular time of gating, with the limits being indicated by the full line pulse at the left of the wave form and by the dotted line pulse at the right of the wave form. In effect, the voltage spike progressively widens along the ramp of the half cycle wave of potential. By the use of the time constant network, including the condenser connected across the emitter-base circuit of each transistor, it has been found that control may be obtained over nearly 180 degrees of each half wave of potential applied to an SCR. This compares with the control of only about 150 degrees of each half wave as possible with a magnetic amplifier.

Figure 4:
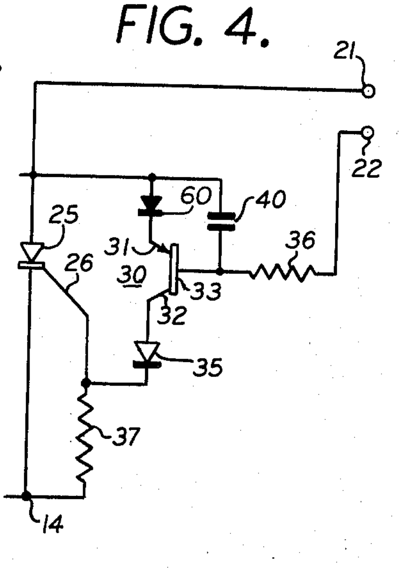
FIG. 4 is a schematic wiring diagram of a part of the circuit illustrated in FIG. 1 and illustrating a modified circuit configuration particularly effective in half wave applications.

In order to effect more perfect control in certain circuit configurations, such as in half wave amplifications, it is desirable to include an additional diode 60 in the emitter circuit of each transistor, as illustrated in FIG. 4. FIG. 4 shows only the transistor, the time constant network, and the associated gating diode, as otherwise the circuitry is essentially the same as that of FIGS. 1 and 2.

While a specific embodiment of the invention has been shown and described in detail to illustrate the application of the principles of the invention, it will be understood that the invention may be embodied otherwise without departing from such principles.

What is claimed is:

1. A voltage regulating circuit for an A.C. generator having an armature and a field winding, said voltage regulating circuit comprising, in combination, a pair of diodes having anodes connected to opposite terminals of said armature, and cathodes commonly connected to one terminal of said field winding; a pair of silicon controlled rectifiers having anodes commonly connected to the other terminal of said field winding and cathodes each connected to an anode of a respective diode; a pair of transistor amplifiers each associated with a respective rectifier and having its emitter-collector circuit connected in parallel with the anode and the gate of the respective rectifier, across said armature; whereby, when the respective rectifier is not conducting the potential thereacross will appear across the emitter-collector circuit of the associated transistor; means operable to apply a control potential, corresponding to the armature voltage, across the emitter-base junctions of said transistors to vary the effective resistances of the emitter-collector circuits thereof; and a pair of capacitors each connected across the emitter-base circuit of a respective transistor; whereby to control the time, during each half cycle, at which a rectifier becomes conductive to supply current through said field winding.

2. A voltage control circuit for an A.C. generator, as claimed in claim 1, including a pair of variable resistors each connected between the gate of a respective rectifier and the associated armature terminal.

3. A voltage control circuit for an A.C. generator, as claimed in claim 1, including a pair of second diodes each connected in series between the collector of a respective transistor and the gate of the associated diode.

4. A voltage control circuit for an A.C. generator, as claimed in claim 3, including a pair of variable resistors each having one end connected to the junction of the cathode of a respective second diode and the gate of the associated rectifier, and a second end connected to the associated armature terminal.

5. A gating control circuit for a gate controlled rectifier comprising, a source of varying potential applied between the anode and cathode of said controlled rectifier, a transistor, interconnecting means connecting the emitter of said transistor to the anode of said controlled rectifier, a diode having its anode connected to the collector of said transistor and its cathode connected to the gate of said controlled rectifier, a variable resistor connected between said gate and cathode of said controlled rectifier, a capacitor connected between the base of said transistor and said interconnecting means, resistor means having a pair of terminals with one of said resistor means terminals connected to the junction of said base and said capacitor, a control signal source having a pair of output terminals connected between the other of said resistor means terminals and the anode of said controlled rectifier, said controlled rectifier responsive to the output of said control signal source to be rendered conductive at a point in the cycle of said varying potential determined by the magnitude of said control signal and said resistor means.

6. A gating control circuit as defined in claim 5 wherein said interconnecting means comprises a diode having its anode connected to the anode of said controlled rectifier and its cathode connected to the emitter of said transistor.

7. A control circuit for an A.C. generator having an aramature with a pair of terminals and a field winding with a pair of terminals comprising; first and second gate controlled rectifiers respectively having their anodes connected to one of said field winding terminals; first and second diodes having their cathodes connected to the other of said field winding terminals and their anodes respectively connected to the cathodes of said controlled rectifiers and respective terminals of said armature; first and second gating circuits for said gate controlled rectifiers with each of said gating circuits comprising, a transistor, means interconnecting the emitter of said transistor to the anode of said controlled rectifier, a diode having its anode connected to the collector of said transistor and its cathode connected to the gate of said controlled rectifier, a variable resistor connected between said gate and cathode of said controlled rectifier, a capacitor connected between the base of said transistor and said means interconnecting the emitter of said transistor to the anode of said controlled rectifier, resistor means having a pair of terminals with one of said resistor means terminals connected to the junction of said base and said capacitor; control signal means for comparing the voltage produced across said armature terminals with a reference potential to provide a control signal, said control signal means being connected between the other of said resistor means terminals and the anode of said controlled rectifier, each of said controlled rectifiers being responsive to said control signals to be rendered conductive at a point in the cycle of said armature voltage determined by the magnitude of each of said control signals and each of said resistor means.

8. A control circuit as defined in claim 7 wherein said means interconnecting the emitter of said transistor to the anode of said controlled rectifier comprises a diode having its anode connected to the anode of said controlled rectifier and its cathode connected to the emitter of said transistor.

9. A control circuit as defined in claim 7 wherein there is included a diode connected across said field winding terminals.

10. A control circuit as defined in claim 7 wherein said control signal means comprises bridge rectifier means having its input terminals connected across said armature terminals, a bridge capacitor connected across the output of said bridge rectifier means, a source of D.C. reference potential connected at its one end to one end of said bridge capacitor, a reference resistor connected between one end of said D.C. reference potential source and the other end of said bridge capacitor, a potentiometer having its resistor portion connected across said bridge capacitor and its wiper arm connected to the anode of said controlled rectifier with the junction of said D.C. reference source and said reference resistor connected to the other of said resistor means terminals.

References Cited by the Examiner

UNITED STATES PATENTS

| | | | |
|---|---|---|---|
| 2,801,346 | 7/1957 | Rongen et al. | |
| 3,009,091 | 11/1961 | Hallidy | 322—28 |
| 3,018,432 | 1/1962 | Palmer. | |
| 3,047,789 | 7/1962 | Lowry | 323—22 |
| 3,129,380 | 4/1964 | Lichowsky. | |
| 3,192,441 | 6/1965 | Wright | 323—22 |

OTHER REFERENCES

Hill, W. R.: Electronics in Engineering, New York, McGraw-Hill 1961, pp. 140–143.

JOHN F. COUCH, *Primary Examiner.*

LLOYD McCOLLUM, *Examiner.*

R. C. SIMS, W. H. BEHA, *Assistant Examiners.*